United States Patent
Yamazaki

(10) Patent No.: US 9,231,554 B2
(45) Date of Patent: Jan. 5, 2016

(54) VIBRATOR ELEMENT, VIBRATOR, ELECTRONIC DEVICE, ELECTRONIC APPARATUS, AND MOVING OBJECT

(71) Applicant: SEIKO EPSON CORPORATION, Tokyo (JP)

(72) Inventor: Takashi Yamazaki, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 180 days.

(21) Appl. No.: 14/166,029

(22) Filed: Jan. 28, 2014

(65) Prior Publication Data

US 2014/0239776 A1  Aug. 28, 2014

(30) Foreign Application Priority Data

Feb. 22, 2013  (JP) ................................ 2013-032934

(51) Int. Cl.
*H03H 9/21* (2006.01)
*H03H 9/05* (2006.01)

(52) U.S. Cl.
CPC ............... *H03H 9/21* (2013.01); *H03H 9/0542* (2013.01); *H03H 9/0547* (2013.01)

(58) Field of Classification Search
CPC ...................................... H03H 9/21
USPC ........................................ 310/370
See application file for complete search history.

(56) References Cited

U.S. PATENT DOCUMENTS

| | | | | |
|---|---|---|---|---|
| 8,390,389 B2* | 3/2013 | Kawai | ...................... | H03H 3/04 310/370 |
| 2002/0089386 A1* | 7/2002 | Kitamura | ................. | H03H 9/21 331/158 |
| 2004/0007065 A1* | 1/2004 | Fujimoto | ........... | G01C 19/5607 73/514.15 |
| 2009/0206704 A1* | 8/2009 | Kitamura | ................. | H03H 3/04 310/357 |
| 2010/0013360 A1* | 1/2010 | Baborowski | ............. | H03H 3/04 310/370 |
| 2010/0320875 A1* | 12/2010 | Takizawa | .................. | H03H 9/21 310/357 |
| 2011/0156826 A1* | 6/2011 | Kawai | ................... | H03H 9/0547 331/116 R |
| 2011/0156827 A1* | 6/2011 | Kawai | ................... | H03H 9/0547 331/116 R |
| 2011/0187470 A1* | 8/2011 | Yamada | ................... | H03B 5/30 331/155 |
| 2011/0221311 A1* | 9/2011 | Iwai | ...................... | H03H 9/0207 310/370 |
| 2012/0025923 A1* | 2/2012 | Takizawa | ............. | H03H 9/0552 331/158 |
| 2012/0194283 A1* | 8/2012 | Funakawa | ............ | H03H 9/0547 331/156 |
| 2012/0194285 A1* | 8/2012 | Yamazaki | ............ | H03H 9/0547 331/158 |

FOREIGN PATENT DOCUMENTS

| | | |
|---|---|---|
| JP | A-2008-224628 | 9/2008 |
| JP | 2009005022 A * | 1/2009 |
| JP | A-2010-193331 | 9/2010 |

(Continued)

*Primary Examiner* — J. San Martin
(74) *Attorney, Agent, or Firm* — Oliff PLC

(57) ABSTRACT

A tuning fork type vibrator element, as a vibrator element, includes a base formed on a plane including a first axis and a second axis orthogonal to the first axis, a connection portion extending in a first axis direction from the base, with a thickness thereof being smaller than that of the base and a vibrating arm extending in the first axis direction from one end portion of the connection portion, with a thickness thereof being the same as that of the connection portion, in which the vibrating arm performs flexural vibration along a vertical direction with respect to the plane, and in which the connection portion is provided such that a relationship between a length L2 in the first axis direction of the connection portion and a length L1 in the first axis direction of the vibrating arm falls within a range of $L1/15 \leq L2 \leq L1$.

9 Claims, 8 Drawing Sheets

(56) References Cited

FOREIGN PATENT DOCUMENTS

| JP | 2011199661 | A | * | 10/2011 |
| JP | 2011234072 | A | * | 11/2011 |
| JP | 2012029024 | A | * | 2/2012 |
| JP | 2012034093 | A | * | 2/2012 |
| JP | A-2012-34093 | | | 2/2012 |
| JP | 2013062643 | A | * | 4/2013 |

* cited by examiner

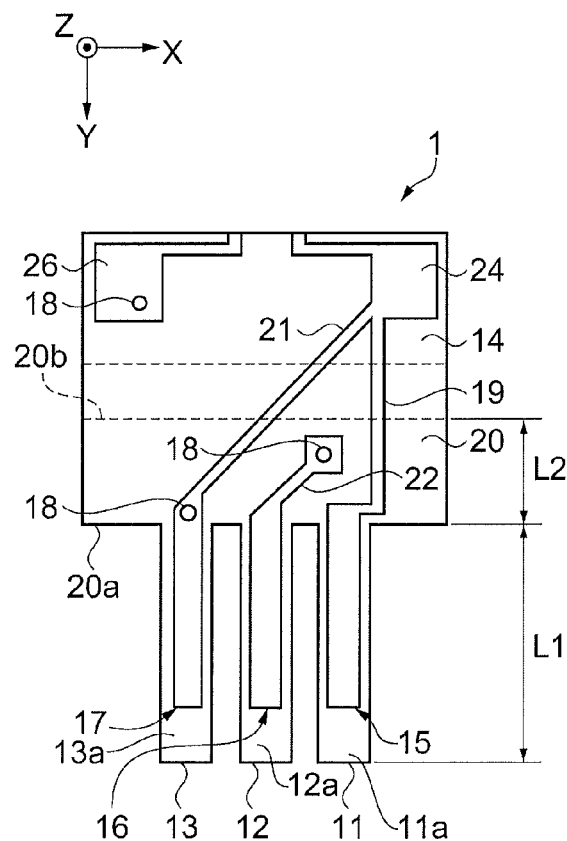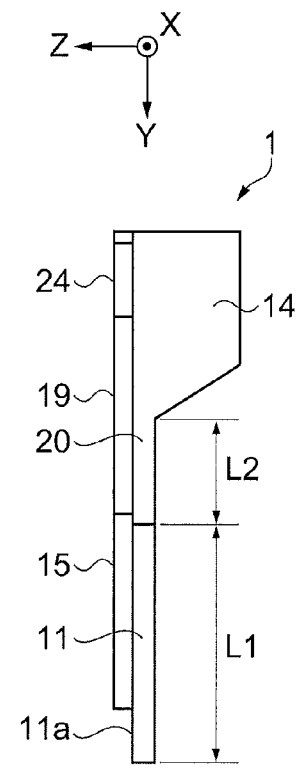
FIG. 2A  FIG. 2C
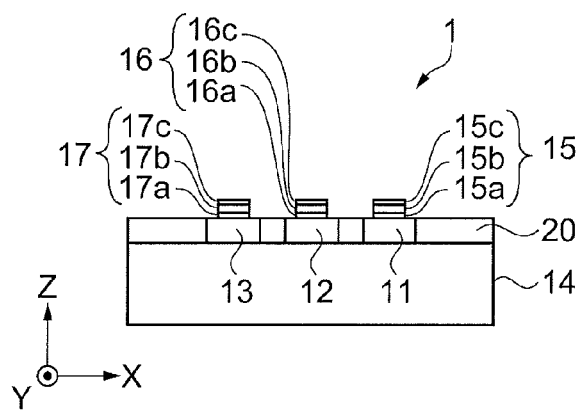
FIG. 2B

VIBRATOR ELEMENT, VIBRATOR, ELECTRONIC DEVICE, ELECTRONIC APPARATUS, AND MOVING OBJECT

BACKGROUND

1. Technical Field

The present invention relates to a vibrator element, and a vibrator, an electronic device, an electronic apparatus, and a movable apparatus that are equipped with the vibrator element.

2. Related Art

As a vibration device is miniaturized, the following vibrator element is adopted in order to realize miniaturization of the vibration device while maintaining the same characteristics as before. Specifically, a construction is adopted in which three vibrating arms extend in the same direction from a base, and the adopted vibrator element is one in which an electrode film and a piezoelectric film are deposited on one surface of each vibrating arm, resulting in a piezoelectric element being formed (for example, refer to JP-A-2012-34093 and JP-A-2008-224628).

However, in the vibrator element disclosed in JP-A-2012-34093, a vibration of the vibrating arm propagates to the base supporting the vibrating arm, and vibration characteristics of the vibrator element deteriorate due to so-called vibration migration. In contrast, in the vibrator element disclosed in JP-A-2008-224628, the vibration migration is suppressed by providing a narrow buffer portion, made smaller in width than the base, between the vibrating arm and the base.

However, in the vibrator element disclosed in JP-A-2008-224628, since the narrow buffer portion is provided between the base and the vibrating arm, for example, if an impact, caused by dropping, is applied to the vibrator element, stress of the impact concentrates on the narrow buffer portion and there is a concern that the vibrator element will be destroyed in a position of the buffer portion. According to the invention, a vibrator element is provided that is excellent in impact resistance and suppresses an occurrence of the vibration migration.

SUMMARY

An advantage of some aspects of the invention is to solve at least a part of the problems described above, and the invention can be implemented as the following forms or application examples.

Application Example 1

This application example is directed to a vibrator element including a base that is provided on a plane that includes a first axis and a second axis orthogonal to the first axis, a connection portion that extends along the first axis from the base, with a thickness thereof being smaller than a thickness of the base, and a vibrating arm that extends along the first axis from one end portion of the connection portion, in which the vibrating arm performs flexural vibration along a vertical direction with respect to the plane, and in which a relationship between a length $L2$ in a first axis direction of the connection portion and a length $L1$ in the first axis direction of the vibrating arm falls within a range of $L1/15 \leq L2 \leq L1$.

According to this application example, the connection portion is provided along the first axis from the base and is provided such that the relationship between the length $L2$ of the connection portion in the first axis direction and the length $L1$ of the vibrating arm in the first axis direction falls within $L1/15 \leq L2 \leq L1$. With this configuration, the damping of vibration of the vibrating arm with the connection portion while preventing deterioration in impact resistance makes it possible to provide the vibrator element that suppresses propagation of the vibration (vibration migration) to the base.

Application Example 2

This application example is directed to the vibrator element according to the application example described above, wherein the vibrating arm includes a first vibrating arm and a second vibrating arm that are provided in parallel with each other, in which the first vibrating arm and the second vibrating arm perform the flexural vibration in opposite directions to each other.

According to this application example, the offsetting of the vibration of the vibrating arms that perform flexural vibration in opposite directions to each other while preventing the deterioration in impact resistance makes it possible to provide the vibrator element that suppresses the propagation of the vibration (the vibration migration) to the base.

Application Example 3

This application example is directed to the vibrator element according to the application example described above, wherein the vibrating arm is the same in thickness as the connection portion.

According to this application example, the concentration of stress on a proximal end of the vibrating arm that results when the vibrating arm performs the flexural vibration can be reduced by making the vibrating arm the same in thickness as the connection portion.

Application Example 4

This application example is directed to the vibrator element according to the application example described above, wherein the base, the connection portion and the vibrating arm are configured by quartz crystal.

According to this application example, a decrease in temperature characteristics (characteristics that have dependence on temperature, such as frequency-temperature characteristics) that results from miniaturization can be suppressed by using the quartz crystal.

Application Example 5

This application example is directed to the vibrator element according to the application example described above, wherein the base, the connection portion and the vibrating arm are configured by a semiconductor.

According to this application example, because processing of a external shape that uses photolithography is easily performed and an etching speed is constant, the formed external shape is uniform, and stabilized characteristics can be obtained.

Application Example 6

This application example is directed to a vibrator including the vibrator element according to any one of the application examples described above and a container that accommodates the vibrator element.

According to this application example, because the vibrator element described above is used, it is possible to provide the vibrator that is capable of improving impact resistance while maintaining the vibration that is stabilized by suppressing the vibration migration.

Application Example 7

This application example is directed to an electronic device including the vibrator element according to any one of the application examples described above and a circuit element that drives the vibrator element.

According to this application example, because the vibrator element described above is used, it is possible to provide the electronic device that is capable of improving the impact resistance while maintaining the vibration that is stabilized by suppressing the vibration migration.

Application Example 8

This application example is directed to an electronic apparatus including the vibrator element according to any one of the application examples described above.

According to this application example, because the vibrator element described above is used, the stabilized vibration characteristics and impact resistance can be obtained and therefore it is possible to provide the electronic apparatus that is stabilized in terms of characteristics.

Application Example 9

This application example is directed to a moving object including the vibrator element according to any one of the application examples described above.

According to this application example, because the vibrator element described above is used, the stabilized vibration characteristics and impact resistance can be obtained and therefore it is possible to provide the moving object that is stabilized in terms of characteristics.

BRIEF DESCRIPTION OF THE DRAWINGS

The invention will be described with reference to the accompanying drawings, wherein like numbers reference like elements.

FIG. 2A is a plan view illustrating an outline of the tuning fork type vibrator element according to the embodiment, FIG. 2B is a front view illustrating an outline of the tuning fork type vibrator element according to the embodiment, and FIG. 2C is an elevation view illustrating an outline of the tuning fork type vibrator element according to the embodiment, when viewed from the right side.

DESCRIPTION OF EXEMPLARY EMBODIMENTS

Figure 1A:
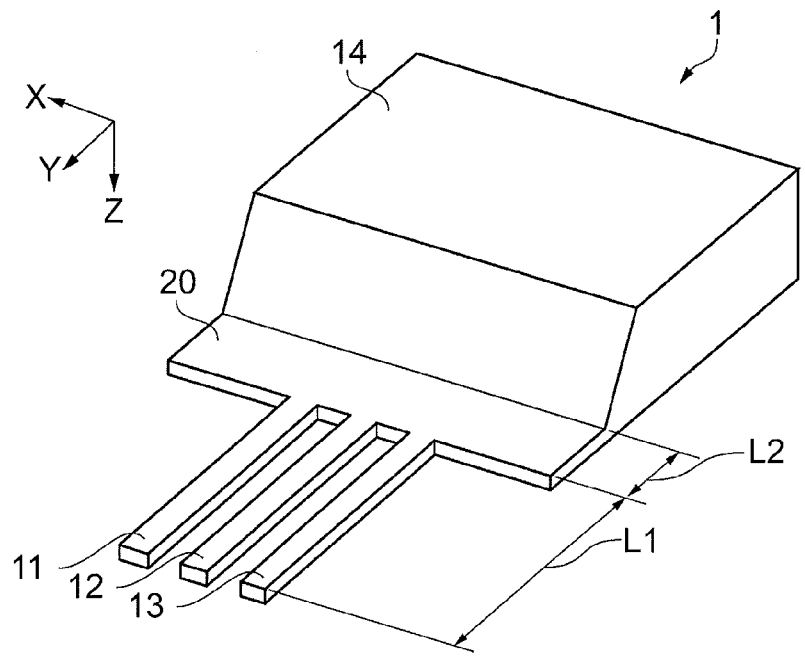
FIG. 1A is a perspective view illustrating an outline of a tuning fork type vibrator element, as a vibrator element, according to an embodiment of the invention.
Figure 1B:
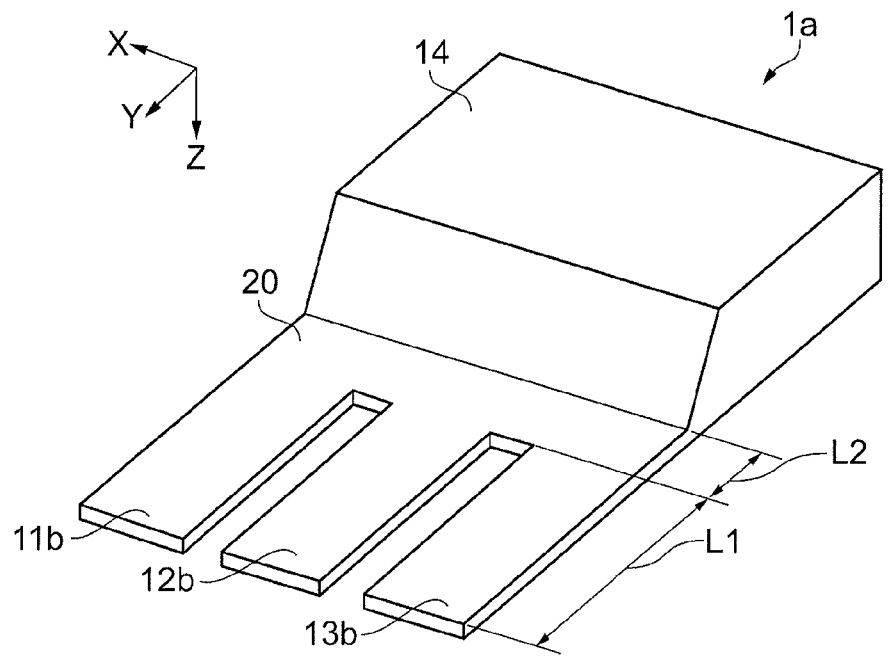
FIG. 1B is a perspective view illustrating an outline of a tuning fork type vibrator element, as the vibrator element, according to another embodiment.

Embodiments of the invention are described below referring to the drawings. FIG. 1A is a perspective view illustrating an outline of a tuning fork type vibrator element, as a vibrator element, according to an embodiment of the invention. FIG. 1B is a perspective view illustrating an outline of a tuning fork type vibrator element, as the vibrator element, according to another embodiment. FIGS. 2A to 2C are views, each illustrating an outline of the tuning fork type vibrator element, as the vibrator element, according to the embodiment of the invention. FIG. 2A is a plan view of the tuning fork type vibrator element. FIG. 2B is a front view of the tuning fork type vibrator element. FIG. 2C is an elevation view of the tuning fork type vibrator element when viewed from the right side. Moreover, for illustration convenience, constituent elements may be illustrated in the drawings in dimension ratios differing from one another.

Embodiment of Vibrator Element

The tuning fork type vibrator element 1 according to the present embodiment illustrated in FIG. 1A, and FIGS. 2A, 2B, and 2C are configured to include vibrating arms 11 and 13 as a first vibrating arm, a vibrating arm 12 as a second vibrating arm, a connection portion 20 that connects to one end of each of the three vibrating arms 11, 12, and 13, a base that connects to the connection portion 20, and piezoelectric elements 15, 16, and 17.

The vibrating arm 11 has a first surface 11a that is arranged toward a first direction (the Z-direction in the drawings). Similarly, a vibrating arm 12 has a first surface 12a that is arranged toward the first direction, and the vibrating arm 13 has a first surface 13a that is arranged in the first direction. According to the present embodiment, the first surfaces 11a, 12a, and 13a are plane surfaces, but are not limited to the plane surfaces and may be a curved surface, an uneven surface, and the like. The vibrating arms 11, 12, and 13 are arranged in such a manner that they are parallel to one another along a second direction (a second axis direction: the X-direction in the drawings) orthogonal to the first direction. The vibrating arms 11, 12, and 13 are arranged in such a manner that their longitudinal directions go along a third direction (a first axis direction: the Y direction in the drawings) that is orthogonal to the second direction. Cross-sectional shapes of the vibrating arms 11, 12, and 13 are, for example, a rectangular shape as illustrated in FIG. 2B, but are not limited to this shape.

An end portion 20a of the connection portion 20 is connected to one end (one end portion that goes along the Y-direction) of each of the three vibrating arms 11, 12, and 13 and thus connects the vibrating arms 11, 12, and 13 to one another. The connection portion 20 is the same in thickness as the vibrating arms 11, 12, and 13, and the front and back surfaces of the connection portion 20 extend from the vibrating arms 11, 12, and 13. That is, there is no difference in step between the connection portion 20 and the vibrating arms 11, 12, and 13, in the thickness direction. The connection portion 20 according to the present embodiment is provided to be the same in width (a dimension in the X-direction in the drawings) as the base 14 described below, but is not limited to this configuration. The connection portion 20 may be configured to be smaller in width than the base 14, or may become narrow in the form of steps.

The base 14 is connected to an end 20b of the connection portion 20, which is opposite to the end portion 20a. One main surface of the base 14 is a surface that extends from the first surfaces 11a, 12a, and 13a of the vibrating arms 11, 12, and 13 with the connection portion 20 in between. The other main surface of the base 14 is provided from an end of the connection portion 20, which is opposite to the end portion 20a, with an inclined surface toward the first direction (the Z-direction in the drawings) and a third direction (the Y-direction in the drawings) in between. In other words, the base 14 is provided from the connection portion 20, in the shape of a thickness that has steps in the first direction, and is formed on a plane that includes a first axis and a second axis that is orthogonal to the first axis.

According to the present embodiment, the vibrating arms 11, 12, and 13, the connection portion 20, and the base 14 are formed into one piece. The vibrating arms 11, 12, and 13, the connection portion 20, and the base 14 are formed, for example, by shaping a quartz crystal plate. The quartz crystal plate preferably should be a Z cut plate from the perspective of a cut angle, but may be an X cut plate or an AT cut plate. If the Z cut plate is used, processing is made easy.

The piezoelectric element 15 is provided on the first surface 11a of the vibrating arm 11. Similarly, the piezoelectric element 16 is provided on the first surface 12a of the vibrating arm 12, and the piezoelectric element 17 is provided on the first surface 13a of the vibrating arm 13.

FIG. 2B illustrates constructions of the piezoelectric elements 15, 16, and 17 that are provided on the first surfaces 11a, 12a, and 13a of the vibrating arms 11, 12, and 13, respectively. Moreover, here, the piezoelectric element 15 is described because the piezoelectric elements 15, 16, and 17 are the same in construction. The piezoelectric element 15 includes a lower electrode film 15a that is arranged on the first surface 11a, a piezoelectric film 15b, as an insulating layer, which is arranged on the lower electrode film 15a, and an upper electrode film 15c that is arranged on the piezoelectric film 15b. The piezoelectric film 15b is a film that includes any one of ZnO, AlN, PZT, $LiNbO_3$, and $KNbO_3$. The piezoelectric film 15b is approximately 0.2 µm in thickness. The piezoelectric film 15b should preferably be set to be approximately 0.025 to 0.25 times as thick as the vibrating arm 11.

Each of the lower electrode films 15a, 16a, and 17a, and each of the upper electrode films 15c, 16c, and 17c are, for example, a conductive film, such as a chromium film, a gold film, a titanium film, an aluminum film, a molybdenum film, and an ITO film. Among these, the lower electrode films 15a and 17a of the piezoelectric elements 15 and 17 and the upper electrode film 16c of the piezoelectric element 16 are electrically connected to one another. The lower electrode films 15a and 17a of the piezoelectric elements 15 and 17 that are provided on the two vibrating arms 11 and 13 are arranged outwardly in the X-direction. The upper electrode film 16c of the piezoelectric element 16 that is provided on one vibrating arm 12 is arranged inwardly in the X-direction. Furthermore, the upper electrode films 15c and 17c of the piezoelectric elements 15 and 17 and the lower electrode film 16a of the piezoelectric element 16 are electrically connected to one another. The upper electrode films 15c and 17c of the piezoelectric elements 15 and 17 that are provided on the two vibrating arms 11 and 13 are arranged outwardly in the X-direction. The lower electrode film 16a of the piezoelectric element 16 that is provided on one vibrating arm 12 is arranged inwardly in the X-direction.

A connection construction of each electrode film is further described referring mainly to FIG. 2A. The upper electrode film 15c and the upper electrode film 17c are electrically connected to each other with an electrode pad 24 in between. In the present embodiment, the upper electrode films 15c and 17c and the electrode pad 24 are integrally formed into one piece. The lower electrode film 16a is electrically connected to the upper electrode film 17c, for example, through a connection wiring line 18, such as through hole wiring (not illustrated). Accordingly, the upper electrode films 15c and 17c and the lower electrode film 16a are electrically connected to one another. Electric signals that are the same in electric potential can be supplied to the upper electrode films 15c and 17c and the lower electrode film 16a through the electrode pad 24.

The lower electrode film 15a and the lower electrode film 17a are electrically connected to each other, for example, through the connection wiring line 18 using the through hole wiring and through an electrode pad 26 (not illustrated). Moreover, in the present embodiment, the electrode pad 26 is formed at the same time as the electrode pad 24. The upper electrode film 16c is electrically connected to the lower electrode film 15a, for example, through the connection wiring line 18 using the through hole wiring and the like, at a position where the upper electrode film 16c extends above the base 14 (not illustrated). Accordingly, the lower electrode films 15a and 17a and the upper electrode film 16c are electrically connected to one another. The electric signals that are the same in electric potential can be supplied to the lower electrode films 15a and 17a and the upper electrode film 16c through the electrode pad 26.

The supplying of the alternate electric signals that are reverse in electric potential to the electrode pad 24 and the electrode pad 26 can make the vibrating arms 11 and 13 vibrated upwards and downwards differently than the vibrating arm 12. Specifically, when applying a voltage between the upper electrode films 15c, 16c, and 17c and the lower electrode films 15a, 16a, and 17a, respectively, a direction of an electric field imposed on each of the piezoelectric elements 15 and 17 on the outside is opposite to a direction of an electric field imposed on the piezoelectric element 16 on the inside. Therefore, a vibration direction of the vibrating arms 11 and 13 is opposite to the vibration direction of the vibrating arm 12, and application of the electric field makes the vibrating arms 11 and 13 upwards and downwards differently than the vibrating arm 12. In other words, the vibrating arms 11 and 13 performs flexural vibration differently than the vibrating arms 12, in a direction perpendicular to a plane including the first axis and the second axis orthogonal to the first axis or along the perpendicular direction.

In this three-arm construction, the connection portion 20 is provided between the vibrating arms 11, 12, and 13 and the base 14 in such a manner that a vibration mode in which the upward and downward vibration (vibration along the Z-direction in the drawing) is used does not propagate in the base 14. Because when the connection portion 20 is small in length and thus an offset of the vibration mode is insufficient, a length of a connection portion is verified as described below.

The connection portion 20 is provided in such a manner that a length L2 in the third direction (the first axis direction:

the Y-direction in the drawings) of the connection portion 20 falls within a range that is determined with the following formula. That is, a relationship between the length L2 in the third direction (the first axis direction: the Y-direction in the drawings) of the connection portion 20 and a length L1 in the third direction (the first axis direction: the Y-direction in the drawings) of the vibrating arm should preferably fall within a range of L1/15≤L2≤L1. Furthermore, the relationship between the length L2 in the third direction (the first axis direction: the Y-direction in the drawings) of the connection portion 20 and the length L1 in the third direction (the first axis direction: the Y-direction in the drawings) of the vibrating arm should preferably fall within a range of L1/10≤L2≤L1. A configuration in which the length L2 in the third direction (the first axis direction: the Y-direction in the drawings) of the connection portion 20 falls within such a range can suppress a phenomenon of vibration migration in which the vibrations of the vibrating arms 11, 12, and 13 propagate to the base 14.

Figure 3:
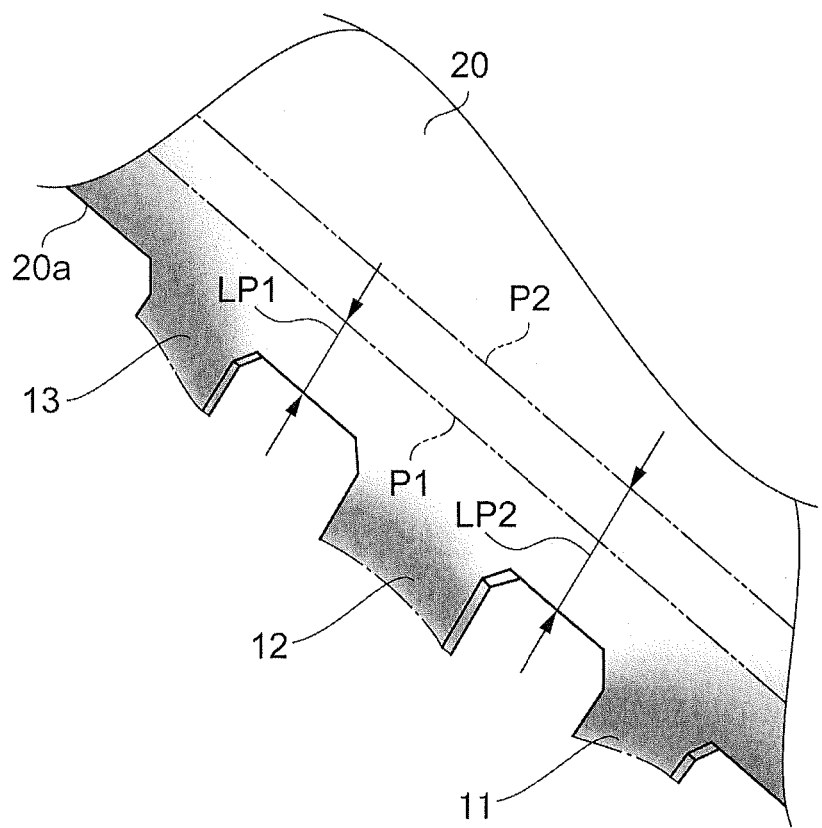
FIG. 3 is a partial perspective view illustrating a result of simulation of displacement distribution of the tuning fork type vibrator element.

The suppression of the propagation of the vibration is described referring to FIG. 3. FIG. 3 is a partial perspective view illustrating a result of simulation of displacement distribution of the tuning fork type vibrator element. FIG. 3 illustrates a link portion between the vibrating arms 11, 12, and 13 (hereinafter collectively referred to as the vibrating arm 11) and the connection portion 20. Furthermore, FIG. 3 illustrates that a deep-black portion is great in displacement and that the thinner the color, the smaller the displacement. Moreover, the vibrating arm 11 of the vibrator element that is used in the present simulation is 300 μm in length.

It is apparent from FIG. 3 that since the vibrating arm 11 vibrates, the displacement becomes at the maximum and that the displacement is almost not present in spacing of LP1 (20 μm in the present example) from the end portion 20a of the connection portion 20 to an imaginary line P1. At this time, a relationship is 1:15 between the spacing of 20 μm from the end portion 20a of the connection portion 20 to the imaginary line P1 and the length of 300 μm of the vibrating arm 11. That is, if the length L2 of the connection portion 20 is such that the length L1 of the vibrating arm 11 is L2/15 or more, the vibration of the vibrating arm 11 is damped within the connection portion 20 and does not propagate up to the base 14. In this manner, if the length L1 of the vibrating arm 11 is L2/15 or more, this can be considered as a range (a lower limit) in which a vibration migration does not propagate.

Furthermore, in the spacing of LP2 (30 μm in the present example) from the end portion 20a of the connection portion 20 to an imaginary line P2, the damping progresses further between the imaginary line P1 and imaginary line P2 and the displacement is not present in the vicinity of the imaginary line P2. At this time, in the same manner as described above, the relationship between the spacing of 30 μm from the end portion 20a of the connection portion 20 to the imaginary line P2 and the length of 300 μm of the vibrating arm 11 is 1:10. That is, if the length L2 of the connection portion 20 is such that the length L1 of the vibrating arm 11 is L2/10 or more, the vibration of the vibrating arm 11 is completely damped within the connection portion 20 and does not propagate up to the base 14. In this manner, if the length L1 of the vibrating arm 11 is L2/10 or more, this is further desirable and can be certainly considered as the range (the lower limit) in which the vibration migration does not propagate.

Figure 4:
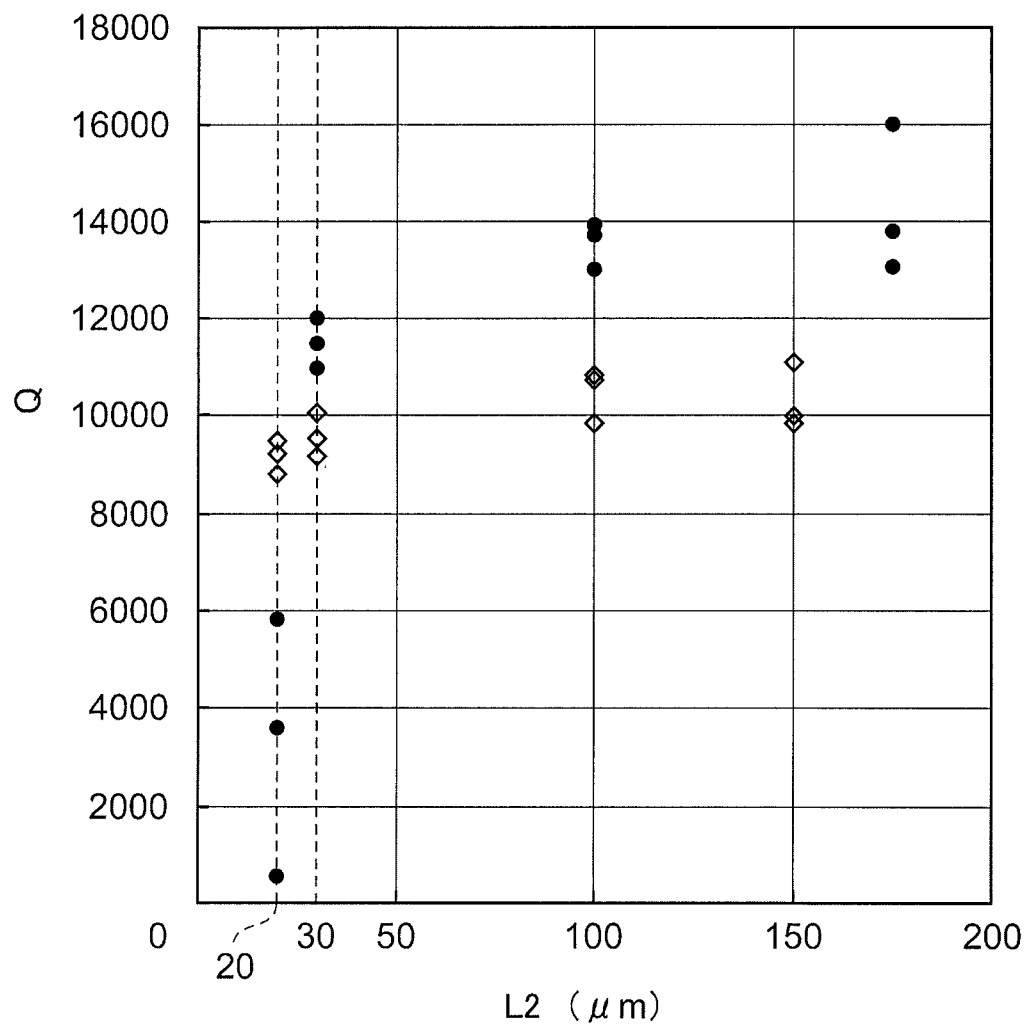
FIG. 4 is a graph that illustrates a relationship between a length L2 of a connection portion and a value Q of the tuning fork type vibrator element.

FIG. 4 illustrates a relationship between the length L2 of the connection portion 20 and a value Q of the tuning fork type vibrator element 1. A white quadrilateral (◇) indicating the value Q in the vibrator element that has a configuration of the tuning fork type vibrator element 1 described above according to the embodiment and a black dot (•) indicating the value Q in the tuning fork type vibrator element 1a illustrated in FIG. 1B are dotted on a graph illustrated in FIG. 4. The tuning fork type vibrator element 1a illustrated in FIG. 1B is configured such that each of the vibrating arm 11b and the vibrating arm 13b has an end portion that extends in the X-direction in the drawings from both ends of the connection portion 20 and the different vibrating arm 12b is arranged between the two vibrating arms 11b and 13b. As illustrated in FIG. 4, if the length L2 of the connection portion 20 is 30 μm or more, a decrease in the value Q does not occur in the tuning fork type vibrator elements 1 and 1a that have their respective configurations. However, when the length L2 of the connection portion 20 is 20 μm, the decrease in the value Q does not occur in the configuration of the tuning fork type vibrator element 1 described above, but the decrease in the value Q is shown in the tuning fork type vibrator element 1a that has the different configuration. That is, shapes of the vibrating arms 11, 12, and 13 of the tuning fork type vibrator element 1 will enable the vibrating arms 11, 12, and 13 to be used at a level that does not cause any problems. As described above, the greater the length L2 of the connection portion 20, the more the vibration migration can be prevented from propagating to the base 14, but when the length L2 is too great, the following disadvantages occurs.

When the length L2 of the connection portion 20 is too great, stiffness of the connection portion 20 is weak, and holding of the vibrating arms 11, 12, and 13 is unstable. Thus, there is a concern that deviation in vibration characteristics occurs. Furthermore, there is a concern that wiring lines 19, 21, and 22 that are connected from the vibrating arms 11, 12, and 13 to the electrode pads 24 and 26 are longer and thus the wiring resistance becomes large and an influence on the vibration characteristics is exerted. Therefore, an upper limit on the length L2 of the connection portion 20 needs to be determined. This need is described below.

As described above (refer to FIG. 2), the wiring line 19 from the piezoelectric element 15 that is provided in the vibrating arm 11 is provided, extending over a region from the vibrating arm 11 through the connection portion 20 to the base 14, and the wiring line 19 electrically connects the piezoelectric element 15 and the electrode pad 24. Similarly, the wiring line 22 from the piezoelectric element 16 that is provided in the vibrating arm 11 and a wiring line on a back surface that is not illustrated are provided, extending over a region from the vibrating arm 12 through the connection portion 20 to the base 14, and the wiring line 22 electrically connects the piezoelectric element 16 and the electrode pad 26. Similarly, the wiring line 21 from the piezoelectric element 17 that is provided in the vibrating arm 13 is provided, extending over a region from the vibrating arm 13 through the connection portion 20 to the base 14, and the wiring line 21 electrically connects the piezoelectric element 17 and the electrode pad 24.

The electrode pads 24 and 26 are connection electrodes for making a connection with a circuit (not illustrated) for driving the tuning fork type vibrator element 1. The greater the length of the connection portion 20, the longer the wiring lines 19, 21, and 22 that are connected to the piezoelectric elements 15, 16, and 17 respectively, and wiring resistances of the wiring lines 19, 21, and 22 are increased. Generally, ITO (thickness 50 nm) is used for the wiring lines 19, 21, and 22, and a sheet resistance is 100 [Ω☐]. If the wiring lines 19, 21, and 22 are assumed to be the same, 300 μm in length as the vibrating arm 11 and are assumed to be 25 μm in width, a wiring resistance is 100 [Ω☐]×300 [μm]/25 μm=1200 [Ω]=1.2 [KΩ].

The wiring resistance is influenced by an arrangement pattern of the wiring lines 19, 21, and 22, but depending on a wiring pattern described above, six times the wiring resistance, that is, 1.2 [KΩ]×6=7.2 [KΩ], occurs with the wiring lines 19, 21, and 22 between the upper electrode films 15c, 16c, and 17c and the lower electrode films 15a, 16a, and 17a, respectively. If a crystal impedance (CI) value of only the vibrating arms 11, 12, and 13 is purely 70 [KΩ], when the length of the connection portion 20 exceeds 300 μm, a resistance value increases by 10% or more. When the CI value increases in excess of 10%, there is an increasing concern that the vibration characteristics deteriorate, such as a case in which the vibration of the tuning fork type vibrator element 1 is difficult to occur. This is not practically preferable. Therefore, the length L2 of the connection portion 20 should not preferably exceed the length L1 of the vibrating arm 11 and the length L1 of the vibrating arm 11 is set to be the upper limit on the length L2 of the connection portion 20.

In the tuning fork type vibrator elements 1 and 1a described above according to the embodiment, the vibrating arms 11, 12, and 13 are connected to the base 14, with the connection portion 20, provided to the length within the range obtained by the following formula, in between.

The damping of the vibration of the vibrating arms 11, 12, and 13a with the connection portion 20 while preventing the deterioration in the impact resistance with $L1/15 \leq L2 \leq L1$ (L1: the length of 11, 12, and 13, L2: the length of the connection portion 20) makes it possible to provide the tuning fork type vibrator elements 1 and 1a that have the vibration characteristics that is stabilized by suppressing the propagation of the vibration (the vibration migration) to the base 14.

Moreover, according to the embodiment, as an example, the vibrating arms 11, 12, and 13, the connection portion 20, and the base 14 are described as being integrally formed into one piece using the quartz crystal plate as a base material of the vibrator element, but the base material is not limited to the quartz crystal. As the base material of the vibrator element, instead of the quartz crystal, a piezoelectric material may be possible, such as lithium tantalate ($LiTaO_3$), lithium tetraborate ($Li_2B_4O_7$), lithium niobate ($LiNbO_3$), lead zirconate titanate (PZT), zinc oxide (ZnO), and aluminum nitride (AlN), or a semiconductor material may be possible, such as silicon.

Furthermore, according to the embodiment, the tuning fork type vibrator element 1 is described as having the three vibrating arms 11, 12, and 13, but the number of the vibrating arm may be one or 5 or more as an odd number.

Vibrator

Figure 5:
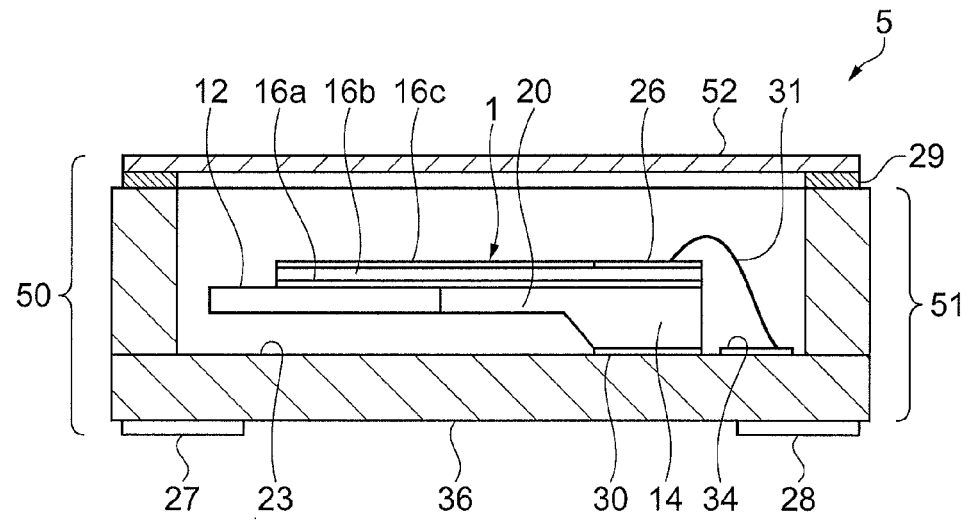
FIG. 5 is a vertical, cross-sectional view illustrating a vibrator that uses the vibrator element according to the invention.

Next, a vibrator including the vibrator element described above according to the embodiment is described with an example of using the tuning fork type vibrator element 1. FIG. 5 is a vertical, cross-sectional view schematically illustrating an outlined configuration of the vibrator. Moreover, the same elements as those described above according to the embodiment are given the same reference numerals and detailed descriptions thereof are omitted. Elements different from those described according to the embodiment are mainly described.

As illustrated in FIG. 5, a vibrator 5 includes the tuning fork type vibrator element 1 described according to the embodiment and a package 50 as a container that contains the tuning fork type vibrator element 1.

The package 50 has a package base 51 that has a concavity portion and a plate-shaped lid 52. The package base 51 has the plane shape, which is, substantially rectangular. The plate-shaped lid 52 has the plane shape, which is, substantially rectangular, covering the concavity portion of the package base 51. The package 50 is formed substantially in the shape of a rectangular parallelepiped. Aluminum oxide-based sintered compact that results from forming, depositing, and sintering a ceramic green sheet, quartz crystal, glass, silicon, and the like are used for the package base 51. The same materials as those for the package base 51 or metals, such as Kovar, 42 alloy, and stainless steel are used for the lid 52.

In the package base 51, an internal terminal 34 is provided on an internal bottom (an internal bottom of the concavity portion) 23. The internal terminal 34 is formed, substantially in the shape of a rectangle, in a position in the vicinity of the electrode pad 26 (24) that is provided in the base 14 of the tuning fork type vibrator element 1. A wiring line, not illustrated, connects the electrode pad 26 (24) to the lower electrode film 16a (15a and 17a) of the tuning fork type vibrator element 1 or the upper electrode film 16c (15c and 17c).

One pair of external terminals 27 and 28 that is used when the package base 51 is mounted on an external member, such as an electronic device, is formed on an external bottom (a bottom opposite to the internal bottom 23 and a bottom on the outside) 36 of the package base 51. An internal wiring line, not illustrated, connects the external terminals 27 and 28 to the internal terminal 34. For example, the external terminal 27 is connected to the internal terminal 34, and the external terminal 28 is connected to a different internal terminal not illustrated. The internal terminal 34 and the external terminals 27 and 28 are made from a metal film that results from depositing a Ni or Au film on a metalized layer such as W (tungsten) using a plating method and the like.

In the vibrator 5, the base 14 (a portion that is thickened by the vibrating arms 11, 12, and 13, and the connection portion 20) of the tuning fork type vibrator element 1 is fixed to the internal bottom 23 of the package base 51, with an adhesive 30, such as an epoxy-based adhesive, a silicone-based adhesive, and a polyimide-based adhesive, in between. Then, in the vibrator 5, a metal wire 31, such as Au and Al, connects the electrode pad 26 (24) of the tuning fork type vibrator element 1 to, for example, the internal terminal 34. In the vibrator 5, in a state where the tuning fork type vibrator element 1 is connected to the internal terminal 34 of the package base 51, the concavity portion of the package base 51 is covered by the lid 52 and the package base 51 and the lid 52 are joined with a bonding member 29, such as a seam ring, a low-melting-point glass, and an adhesive. This makes the inside of the package 50 sealed in an airtight manner. Moreover, the inside of the package 50 is in a decompressed state (in a high degree vacuum state) or in a state of being filled up with an inactive gas, such as nitrogen, helium, and argon.

Moreover, the package may be configured by a package base in the shape of a plate, a lid that has a concavity portion, and the like. Furthermore, the package may have the concavity portions in both of the package base and the lid.

In the vibrator 5, each of the vibrating arms (12 and the like) of the tuning fork type vibrator element 1 vibrates (resonates) at a predetermined frequency with a drive signal (an alternating voltage) that is applied to each of the piezoelectric elements (16 and the like) through the external terminals 27 and 28, the metal wire 31, the electrode pad 26 (24).

As described above, the vibrator 5 includes the tuning fork type vibrator element 1. Thus, the vibrator 5 has vibration characteristics stabilized because of an effect described according to the embodiment, that is, an effect that suppresses the propagation of the vibration (the vibration migration) to the base 14, which results from the vibration of the vibrating arm 12 (11 and 13) attenuating in the connection portion 20, while preventing the deterioration in the impact resistance.

Electronic Device

Figure 6:
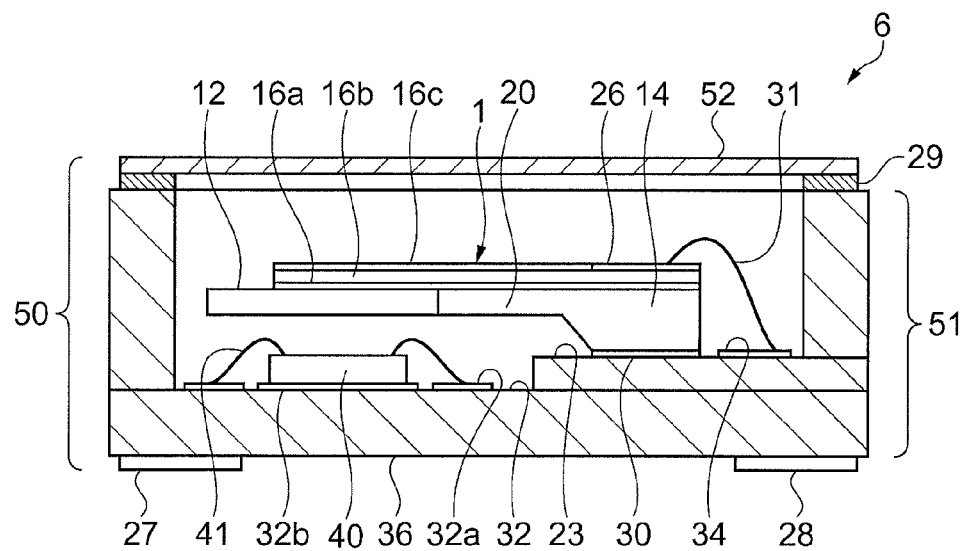
FIG. 6 is a vertical, cross-sectional view illustrating an oscillator as an electronic device that uses the vibrator element according to the invention.

Next, an oscillator as an electronic device that includes the vibrator element described above according to the embodiment is described with an example of using the tuning fork type vibrator element 1. FIG. 6 is a vertical, cross-sectional view schematically illustrating an outlined configuration of the oscillator as one example of the electronic device. Moreover, a description of each wiring line is omitted. Furthermore, the same elements as those described according to the embodiment are given the same reference numerals and detailed descriptions thereof are omitted. Elements different from those according to the embodiment are mainly described.

As illustrated in FIG. 6, the oscillator 6 includes the tuning fork type vibrator element 1 described according to the embodiment, an IC chip 40 as an oscillation circuit (a circuit element) that oscillates (drives) the tuning fork type vibrator element 1, and the package 50 that accommodates the tuning fork type vibrator element 1 and the IC chip 40.

An internal connection terminal 32a is provided on an internal bottom 32 of the package base 51. The IC chip 40 into which the oscillation circuit is built is fixed to the internal bottom 32 of the package base 51 using an adhesive 32b and the like. In the IC chip 40, a metal wire 41, such as Au or Al, connects a connection pad not illustrated to the internal connection terminal 32a.

The internal connection terminal 32a is made from a metal film that results from depositing a Ni or Au film on a metalized layer such as W (tungsten) using a plating method and the like. The internal connection terminal 32a is connected to the external terminals 27 and 28 of the package 50, the internal terminal 34, and the like, through internal wiring lines, not illustrated. Moreover, in addition to a connection method of performing wire bonding with the metal wire 41, a connection method of using flip chip mounting to invert the IC chip 40 may be employed to connect the connection pad of the IC chip 40 and the internal connection terminal 32a.

Furthermore, the internal terminal 34 is provided on the internal bottom (the internal bottom of the concavity portion) 23 of the package base 51. The internal terminal 34 is formed, substantially in the shape of a rectangle, in a position in the vicinity of the electrode pad 26 (24) that is provided in the base 14 of the tuning fork type vibrator element 1. Wiring lines, not illustrated, connects the electrode pad 26 (24) to the lower electrode films 15a, 16a, and 17a of the tuning fork type vibrator element 1 or each of the upper electrode films 15c, 16c, and 17c.

In the tuning fork type vibrator element 1, the base 14 (a portion that is thickened by the vibrating arms 11, 12, and 13, and the connection portion 20) is fixed to the internal bottom 23 of the package base 51, with an adhesive 30, such as an epoxy-based adhesive, a silicone-based adhesive, and a polyimide-based adhesive, in between. Then, in the vibrator 5, a metal wire 31, such as Au and Al, connects the electrode pad 26 (24) of the tuning fork type vibrator element 1 to, for example, the internal terminal 34.

In the oscillator 6, each of the vibrating arms (12 and the like) of the tuning fork type vibrator element 1 vibrates (resonates) at a predetermined frequency with a drive signal that is applied from the IC chip 4C to the lower electrode films 15a, 16a, and 17a, or to each of the upper electrode films 15c, 16c, and 17c through the internal connection terminal 32a, the internal terminal 34, the metal wire 31, and the electrode pad 26 (24). Then, the oscillator 6 outputs an oscillation signal that is generated according to the oscillation to the outside through the IC chip 40, the internal connection terminal 32a, the external terminals 27 and 28, and the like.

As described above, the oscillator 6 includes the tuning fork type vibrator element 1. Thus, the oscillator 6 has vibration characteristics stabilized because of an effect described according to the embodiment, that is, an effect that suppresses the propagation of the vibration (the vibration migration) to the base 14, which results from the vibration of the vibrating arm 12 (11 and 13) attenuating in the connection portion 20, while preventing the deterioration in the impact resistance.

Moreover, the oscillator 6 may have a module construction (for example, a construction in which a quartz crystal vibrator and the IC chip are individually mounted on one substrate) in which attachment is externally configured, without the IC chip 40 being built into the package 50.

Electronic Apparatus

Subsequently, an electronic apparatus to which the tuning fork type vibrator element 1 as the vibrator element according to one embodiment of the invention is applied is described in detail referring to FIGS. 7 to 9. Moreover, descriptions are provided illustrating an example of using the tuning fork type vibrator element 1, but a configuration may be possible in which the vibrator 5 using the tuning fork type vibrator element 1 or the oscillator 6 using the tuning fork type vibrator element 1 is applied.

Figure 7:
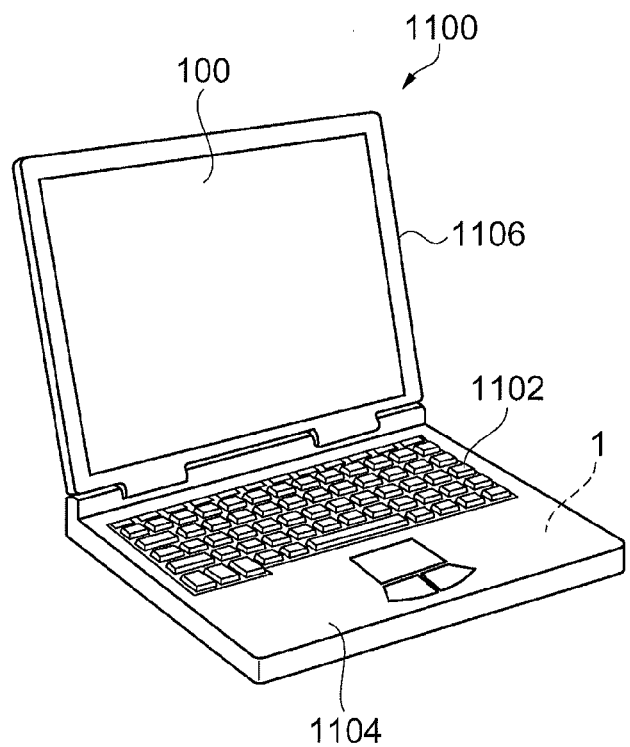
FIG. 7 is a perspective view illustrating a configuration of a mobile-type personal computer as one example of an electronic apparatus.

FIG. 7 is a perspective view illustrating an outline of a configuration of a mobile-type (or notebook-type) personal computer as the electronic apparatus including the tuning fork type vibrator element 1 according to one embodiment of the invention. As illustrated in FIG. 7, a personal computer 1100 is configured by a main body 1104 including a keyboard 1102, and a display unit 1106 including a display section 100. The display unit 1106 is supported by a hinge mechanism in such a manner that the display unit 1106 can be rotated with respect to the main body 1104. The tuning fork type vibrator element 1 as a reference signal source is built into the personal computer 1100.

Figure 8:
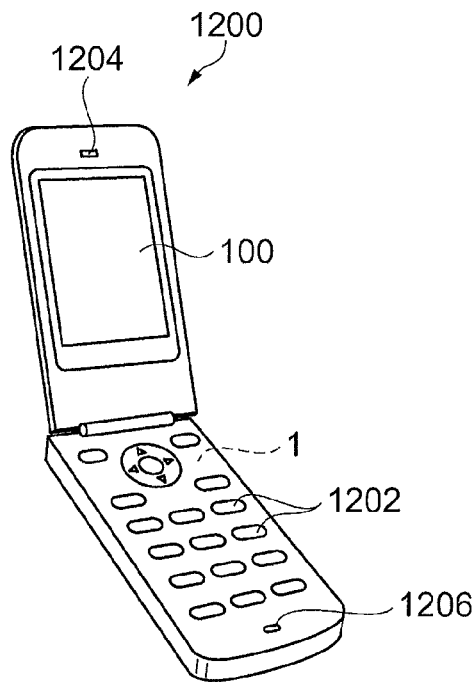
FIG. 8 is a perspective view illustrating a configuration of a mobile phone as one example of the electronic apparatus.

FIG. 8 is a perspective view illustrating an outline of a configuration of a mobile phone (including PHS as well) as the electronic apparatus including the tuning fork type vibrator element 1 according to one embodiment of the invention. As illustrated in FIG. 8, the mobile phone 1200 includes multiple operational buttons 1202, an ear piece 1204, and a mouth piece 1206. The display section 100 is arranged between the operational buttons 1202 and the ear piece 1204. The tuning fork type vibrator element 1 as the reference signal source and the like is built into the mobile phone 1200.

Figure 9:
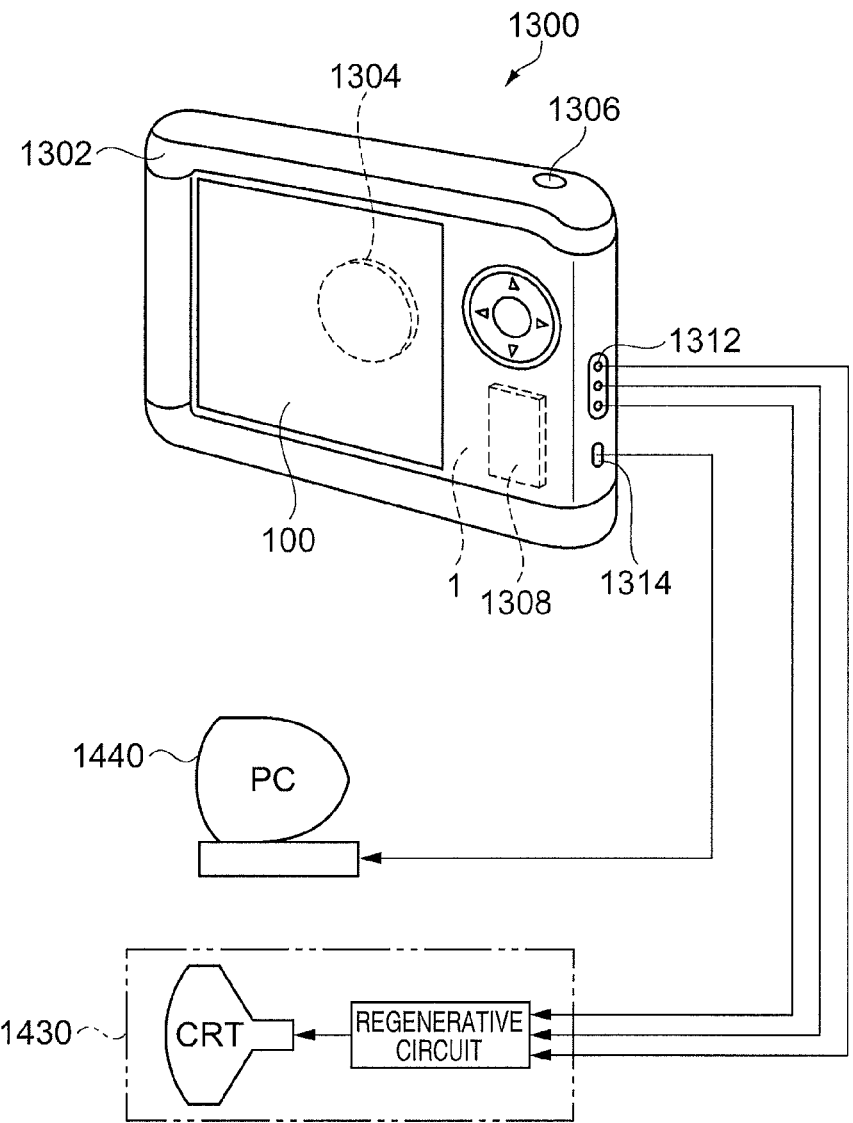
FIG. 9 is a perspective view illustrating a configuration of a digital still camera as one example of the electronic apparatus.

FIG. 9 is a perspective view illustrating an outline of a configuration of a digital still camera as the electronic apparatus including the tuning fork type vibrator element 1 according to one embodiment of the invention. Moreover, FIG. 9 illustrates also a connection with an external apparatus in a simplified manner. At this point, while a normal camera exposes an analog photography film using a light image of a photographic subject, a digital still camera 1300 generates an imaging signal (an image signal) by performing photoelectric conversion on the light image of the photographic subject using an imaging element, such as a charge coupled device (CCD). In the digital still camera 1300, the display section 100 is provided on a back surface of a case (body) 1302 and is configured in such a manner as to perform display based on the imaging signal resulting from the CCD. The display section 100 functions as a finder on which the photographic subject is displayed as an electronic image. Furthermore, a light receiving unit 1304 that includes an optical lens (an imaging optical system), the CCD, or the like is provided on to the front surface side of the case 1302 (to the side of the back surface in the drawings).

When a person who takes a photograph checks the photographic subject that is displayed on the display section 100 and pushes down a shutter button 1306, the imaging signal of the CCD at this time is transmitted to and stored in a memory 1308. Furthermore, in the digital still camera 1300, a video signal output terminal 1312 and an input/output terminal 1314 for data communication are provided on a lateral side of the case 1302. Then, as illustrated in FIG. 9, if necessary, a television monitor 1430 is connected to the video signal output terminal 1312, and a personal computer 1440 is connected to the input/output terminal 1314 for data communication. Moreover, the imaging signal that is stored in the memory 1308 with a predetermined operation is configured such that the imaging signal is output to the television monitor 1430 or the personal computer 1440. The tuning fork type vibrator element 1 as the reference signal source and the like is built into the digital still camera 1300.

Moreover, in addition to the personal computer (the mobile-type personal computer) in FIG. 7, the mobile phone in FIG. 8, the digital still camera in FIG. 9, the tuning fork type vibrator element 1 according to one embodiment of the invention, for example, can be applied to electronic apparatuses, such as an ink jet type discharging apparatus (for example, an ink jet printer), a laptop-type personal computer, a television set, a camcorder, a video tape recorder, a car navigation apparatus, a pager, an electronic organizer (including an electronic organizer equipped with a communication function), an electronic dictionary, a calculator, an electronic game apparatus, a word processor, a workstation, a television telephone, a television monitor for crime prevention, electronic binoculars, a POS terminal, medical apparatuses (for example, an electronic thermometer, a manometer, a blood glucose meter, an electrocardiogram measurement apparatus, an ultrasonic diagnostic apparatus, and an electronic endoscopy), a fish finder, various measurement apparatuses, meters (for example, meters for a car, an airplane, and a ship), and a flight simulator.

Moving Object

Figure 10:
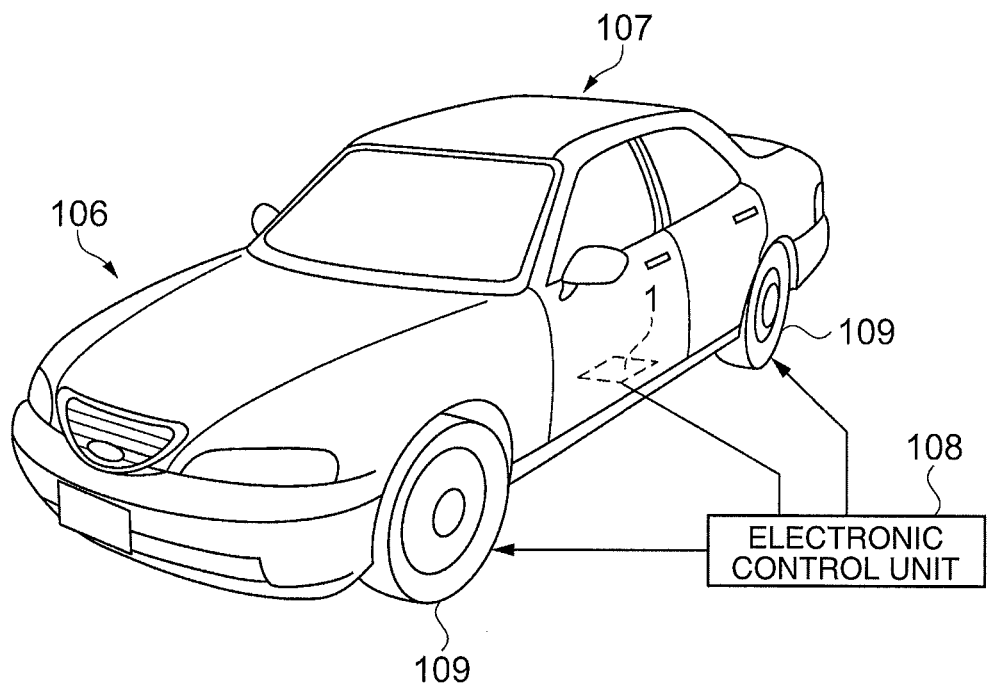
FIG. 10 is a perspective view illustrating a motor car as one example of a moving object.

FIG. 10 is a perspective view schematically illustrating a motor car as one example of a moving object. The tuning fork type vibrator element 1 according to the invention is mounted on the motor car 106. For example, as illustrated in FIG. 10, in the motor car 106 as the moving object, an electronic control unit 108 into which the tuning fork type vibrator element 1 is built and which controls tires 109 and the like are mounted on a motor car frame 107. Furthermore, additionally, the tuning fork type vibrator element 1 can be broadly applied to an electronic control unit (ECU), such as keyless entry, immobilizer, a car navigation system, a car air conditioner, an anti-lock brake system (ABS), an air bag, a tire pressure monitoring system (TPMS), engine control, battery monitors for a hybrid motor car and an electric motor car, an attitude control system for a motor car frame, and the like.

The entire disclosure of Japanese Patent Application No. 2013-32934, filed Feb. 22, 2013 is expressly incorporated by reference herein.

What is claimed is:

1. A vibrator element comprising:
  a base that includes a plane that includes a first axis and a second axis orthogonal to the first axis;
  a connection portion that is smaller in thickness than the base and extends along the first axis from the base; and
  a vibrating arm that extends along the first axis from one end portion of the connection portion,
  wherein the vibrating arm performs flexural vibration in a direction that intersects with respect to the plane, and
  wherein a length L2 of the connection portion in a first axis direction and a length L1 of the vibrating arm in the first axis direction fall within a range of $L1/15 \leq L2 \leq L1$.

2. The vibrator element according to claim 1,
  wherein the vibrating arm includes a first vibrating arm and a second vibrating arm parallel to the first vibrating arm, and
  wherein the first vibrating arm and the second vibrating arm perform the flexural vibration in opposite directions to each other.

3. The vibrator element according to claim 1,
  wherein a step in a thickness direction is not present between the vibrating arm and the connection portion.

4. The vibrator element according to claim 1,
  wherein the base, the connection portion, and the vibrating arm include quartz crystal.

5. The vibrator element according to claim 1,
  wherein the base, the connection portion, and the vibrating arm have a semiconductor.

6. A vibrator comprising:
  the vibrator element according to claim 1, and
  a container that accommodates the vibrator element.

7. An electronic device comprising:
  the vibrator element according to claim 1, and
  a circuit element that drives the vibrator element.

8. An electronic apparatus comprising:
  the vibrator element according to claim 1.

9. A moving object comprising:
  the vibrator element according to claim 1.

* * * * *